United States Patent [19]

Andricacos et al.

[11] Patent Number: 5,789,320

[45] Date of Patent: Aug. 4, 1998

[54] PLATING OF NOBLE METAL ELECTRODES FOR DRAM AND FRAM

[75] Inventors: Panayotis Constantinou Andricacos, Croton-on-Hudson; James Hartfiel Comfort, New City; Alfred Grill, White Plains; David Edward Kotecki, Hopewell Junction; Vishnubhai Vitthalbhai Patel, Yorktown; Katherine Lynn Saenger, Ossining; Alejandro Gabriel Schrott, New York, all of N.Y.

[73] Assignee: International Business Machines Corporation, Armonk, N.Y.

[21] Appl. No.: 636,456

[22] Filed: Apr. 23, 1996

[51] Int. Cl.$^6$ .................................................. H01L 21/44
[52] U.S. Cl. ............................................. 438/678; 438/650
[58] Field of Search ................................. 437/189, 230; 438/396, 397, 643, 653, 660, 739, 650, 678

[56] References Cited

U.S. PATENT DOCUMENTS

| | | | |
|---|---|---|---|
| 5,342,806 | 8/1994 | Asahina | 437/195 |
| 5,561,082 | 10/1996 | Matsuo et al. | 437/187 |
| 5,565,707 | 10/1996 | Colgan et al. | 257/62 |
| 5,633,781 | 5/1997 | Saenger et al. | 361/321.4 |

*Primary Examiner*—Charles L. Bowers, Jr.
*Assistant Examiner*—Reneé R. Berry
*Attorney, Agent, or Firm*—Scully, Scott, Murphy & Presser

[57] ABSTRACT

Noble metal plating on a preexisting seed layer is used in the fabrication of electrodes for DRAM and FRAM. The plating may be spatially selective or nonselective. In the nonselective case, a blanket film is first plated and then patterned after deposition by spatially selective material removal. In the selective case, the plated deposits are either selectively grown in lithographically defined areas by a through-mask plating technique, or selectively grown as a conformal coating on the exposed regions of a preexisting electrode structure. A diamond-like carbon mask can be used in the plating process. A self-aligned process is disclosed for selectively coating insulators in a through-mask process.

29 Claims, 8 Drawing Sheets

PLATING OF NOBLE METAL ELECTRODES FOR DRAM AND FRAM

BACKGROUND OF THE INVENTION

1. Field of the Invention

The present invention is directed to plating noble metals for electrodes in DRAM and FRAM high density storage elements. This invention is also directed to the use of a diamond like carbon mask in the plating of noble metal electrodes and other materials. The present invention is further directed to a self-aligned process for selectively coating insulators in through-mask plated metal structures.

2. Description of the Prior Art

The fabrication of small geometry high-dielectric constant capacitors suitable for Gigabit scale DRAM suffers from complications due to topography, electrode material patterning, reaction of high-ε material (HEM) with Si contact and ultimate density/scalability. Various capacitor materials, processes, and designs have been proposed, but it is not clear that any of them will result in a manufacturable product at satisfactory yield and cost.

Plating is a technique used extensively in fabricating packaging and magnetic storage components but its use in the microelectronics industry has been limited.

Previous uses have primarily been for back-end-of-the-line (BEOL) ball/bump contacts of chips to packages. Recently, Cu plating has been applied to a BEOL via filling for a Damascene process. However, noble metal plating has never been used for any front-end-of-the-line process in the microelectronics industry.

The suitability and possible requirement of noble metal electrodes for DRAM and FRAM high density storage elements incorporating HEM is also known. This is because HEM deposition involves high temperature growth and/or treatment in an oxidizing environment. However, prior art pertaining to noble metal electrode deposition for these applications involves deposition by processes such as chemical vapor deposition, sputtering, evaporation, and ion beam deposition.

The use of through-mask plating technology is limited by the requirement that the mask material must be compatible with the plating solution, and, for the case of electrolytic plating, that the mask be electrically insulating. Mask materials of photoresist, polyimide, and silicon dioxide typically restrict the use of through-mask plating to acidic or weakly alkaline plating solutions. However, through-mask plating with strongly alkaline plating solutions is a desirable option due to potentially interesting applications in BEOL and magnetic storage.

Noble metals such as Pt, Ir, Ru, and Pd are likely to be the preferred electrode materials in future generation memory devices incorporating high-epsilon materials, and through-mask plating is a potentially useful technique for patterning these difficult-to-etch materials. However, for the several device designs in which the patterned electrodes must be capped with an identically patterned dielectric, the benefits of an additive process such as plating are questionable unless a way can be found to apply the additional dielectric without a separate patterning step. Thus, there is a need for a self-aligned process for selectively coating insulators on through-mask plated metal structures.

SUMMARY OF THE INVENTION

The present invention is directed to methods for plating noble metals for electrodes in DRAM and FRAM high density storage elements. The noble metals can be formed into the desired shapes by plating a blanket film and patterning it after deposition, or by selectively growing the plated deposits in lithographically defined areas. Processing advantages provided by the present invention include lower cost, simpler processing (avoidance of RIE and/or CMP), and potentially improved control of film stress and microstructure.

The plated noble metals may include pure noble metals (e.g., Pt, Pd, Au, Ir, Rh, Ru and Os), alloys of noble metals with noble or non-noble metals (e.g., PtIr, PdPt and PdNi), and bi- or multilayers (e.g. Pt/Pd/Pt). Examples of processes to form electrodes from this category of materials include plating a blanket film and patterning it after deposition, and selectively growing plated deposits to form electrodes in lithographically defined areas. The latter method for electrode fabrication includes the following steps:

a) blanket deposition of a seed layer or "plating base" layer by a process selected from the group consisting of sputtering, evaporation, electroless deposition, or any other physical or chemical deposition process;

b) application and patterning of a first disposable material to cover regions where plating is not desired, where thickness of said first disposable material equals or exceeds the anticipated thickness of the plated deposit;

c) plating regions not covered by the first disposable material with an electrically conductive material which may or may not be the same as the plating base material;

d) removing the first disposable material; and e) electrically isolating the plated electrode structure from the plating base exposed by removal of the first disposable material.

The plating base exposed by removal of the first disposable material can be removed by a process selected from the group consisting of ion beam sputtering, RIE, and any other physical etching or chemical etching/reaction technique. Alternatively, the plating base exposed by removal of the first disposable material can be made to become insulating by a process such as oxidation, anodization, etc.

Implementations of this invention require a plating process, which includes electrolytic plating (electroplating), electroless plating or a combination of the two. These processes typically require the use of a "seed layer" or plating base. Requirements for the plating base are that it be sufficiently electrically conductive, adherent to the substrate, have a surface conducive to the growth of the plated deposit (e.g., free of a passivating oxide). A plating base for electrolytic plating must further be in a single, topographically connected piece. The plating base typically has a thickness of 300–2000 Å, but may possibly be as thin as 30 Å. Suitable plating base materials include noble metals, Cu, Sn, In, Pb, Co, Ni, and alloys of noble metals (e.g., PdSn). Conductive oxides would also be expected to be satisfactory as plating bases. The plating base may be deposited by a variety of processes including evaporation, sputtering, chemical treatment of the surface, and in some cases, electroless plating.

Also disclosed herein is a diamond like carbon (DLC) mask (or mask coating material) for plating applications. DLC is an insulating material whose corrosion resistance allows it to withstand strongly alkaline plating solutions which would ordinarily be avoided for lack of suitable masking materials. DLC is similarly resistant to strongly acidic solutions. DLC is simple to apply (e.g., by plasma enhanced chemical vapor deposition (PECVD)) and pattern (e.g., by reactive ion etching (RIE) in oxygen plasma). It is much stiffer than typical photoresists, having a hardness of about 10–20 GPa and Young's modulus of about 100 GPa. Previously, the chemical inertness of DLC has led to its proposed use as a masking material for anisotropic wet etching of silicon in strongly alkaline etching solutions.

Several uses of DLC as a masking material for plating applications are disclosed. One such application is where the DLC is used as a mask in a conventional through-mask plating configuration in which the thickness of the plated deposit is less than or approximately equal to the thickness of the mask, and the plating selectively occurs only in the mask openings. Another use is where the DLC is used as a mask in a Damascene-type process where the plating is blanket and the DLC remains in the final structure. Yet another use is where the DLC is used as a mask in a Damascene-type process where the plating is blanket and the DLC does not remain in the final structure. In addition, the DLC can be used as a thin protective coating over a previously patterned layer of masking material. The term DLC is taken to include standard hydrogenated or non-hydrogenated amorphous carbon (DLC), fluorinated amorphous carbon (F-DLC), or DLC or F-DLC containing one or more additives selected from the group containing oxygen, silicon, nitrogen, and all metallic elements.

This invention allows through-mask plating to be used with strongly alkaline plating solutions thus enabling the following processes:

1) through-mask plating of noble metal electrodes for use with high-epsilon dielectrics in DRAM and ferroelectrics in non-volatile FRAM.
2) plating of NiFe as well as high magnetic moment materials for write heads in magnetic storage technology, using plating solutions which incorporate complexants and additives that operate only in alkaline environments.
3) electroless Cu technology for BEOL applications where Cu plating solutions adversely attack both $SiO_2$, polyimide, and other interlayer dielectric (ILD) materials.
4) plating of Cu-X (X=any of the elements Ag, Zn, Cd, Au, Pd, Hg, Pt, In, Ni, B, Sn, Co, Cr, Ge, or Pb, alone or in combination) from alkaline solutions, a promising alternative to Cu-X plating from acid solutions (which is very difficult).
5) plating Au and Au alloys for connectors, X-ray masks, and other applications, from alkaline solutions.

Also disclosed here is a self-aligned process for selectively coating insulators on through-mask plated metal structures to form a patterned "cap dielectric." The process uses readily available materials and process steps and avoids the use of an additional masking and alignment step by using the original mask twice. It is also simple enough to preserve the benefits of using through-mask plating for electrode patterning. The steps are listed below:

1) Deposit seed layer or plating base on substrate consisting of dielectric and a conductive plug.
2) Apply and pattern the masking material. The masking material must withstand exposure to (i) the plating solution and (ii) the cap dielectric deposition process. Furthermore, with respect to the cap dielectric, it should be (i) a good polish stop and (ii) selectively etchable. A material meeting these requirements might be diamond-like carbon (DLC). The thickness of the mask should be approximately equal to or greater than the sum of the electrode and desired cap layer thicknesses.
3) Through-mask plate the metal electrode material to the desired thickness.
4) Deposit the cap dielectric. The cap dielectric might be, for example, $SiO_2$ or $SiN_x$.
5) Planarize the cap dielectric by a process such as chemical mechanical polishing (CMP).
6) Selectively remove the mask material and the exposed plating base.

It should be noted that in addition to the example given (DLC mask with $SiO_2$ or $SiN_x$ cap dielectric), one might also use $SiO_2$ or $SiN_x$ as the mask and $SiN_x$ or $SiO_2$ as the cap dielectric, since each material can withstand the deposition of the other, and selective etch processes exist for both.

BRIEF DESCRIPTION OF THE DRAWINGS

FIGS. 18(a)–18(h) are cross-sectional views depicting various steps in the process of forming the structure of FIG. 17 in accordance with the present invention.

DETAILED DESCRIPTION OF THE INVENTION

The present invention is directed to noble metal plating as a technique for fabrication of electrode structures for DRAM and FRAM. The plating may be electrolytic and/or electroless plating. Electrodes of noble metals are needed for DRAM and FRAM devices incorporating ferroelectric or high-epsilon dielectric materials because deposition of these dielectric materials involves growth and/or treatment in a high temperature oxidizing environment. Plating is a relatively inexpensive process for fabricating noble metal electrodes, since materials deposition is highly efficient and does not require the use of vacuum equipment. Moreover, the through-mask plating embodiment of this invention has the further advantage that patterning is accomplished additively, thus avoiding the problematic noble metal etching steps that would be required for a subtractive patterning process.

Figure 1:
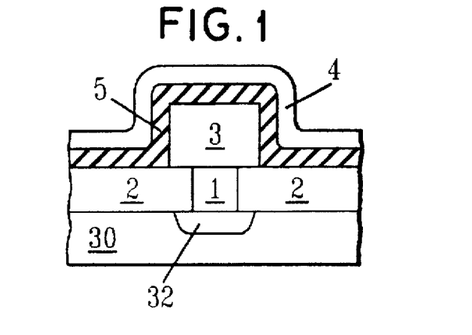
FIG. 1 is a cross-sectional view of one embodiment of a capacitor having electrodes formed by one method of the present invention.
Figure 2:
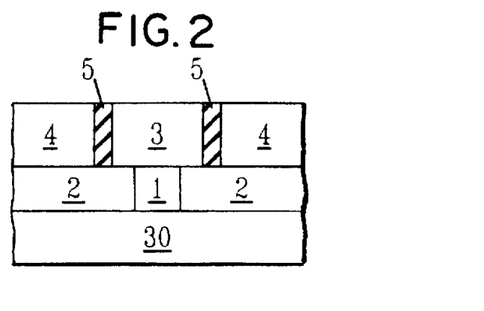
FIG. 2 is a cross-sectional view of another embodiment of a capacitor having electrodes formed by a method of the present invention.

FIGS. 1 and 2 show cross-sections of two capacitor structures containing electrodes fabricated with the present invention. Both capacitors are shown on similar substrate structures consisting of electrically conductive plugs 1 embedded in dielectric layer 2 formed on a substrate 30 having a contact 32. Bottom electrode 3 is electrically isolated from top electrode 4, and is in good electrical contact to plug 1. In a DRAM or FRAM device, a very large number of capacitors are formed on a single substrate such that bottom electrodes 3 are insulated from each other while top electrodes 4 are electrically connected to each other. A thin layer of ferroelectric or capacitor dielectric material 5 lies between the top and bottom electrodes. In the stack capacitor design of FIG. 1, the bottom electrode 3 is fabricated by plating. In the isolated sidewall capacitor design of FIG. 2, the bottom 3 and/or top 4 electrodes are fabricated by plating.

The plating process may be spatially selective or nonselective. In nonselective embodiments of the invention, electrode fabrication is accomplished by plating a blanket film on a blanket seed layer. For example, the plated deposits may be grown on a substantially planar substrate and subsequently patterned by a subtractive etch process. The key fabrication steps for this embodiment are illustrated in FIG. 3 for the case of the top electrode 4 in the isolated sidewall capacitor of FIG. 2. Note that the same process steps shown in FIG. 3 could be used with a different mask to instead fabricate the bottom electrode (3 in FIGS. 1 and 2).

Figure 3A:
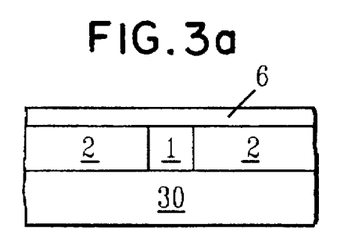
FIGS. 3(a)–3(e) are cross-sectional views depicting various steps in a nonselective plating process of the present invention.
Figure 3B:
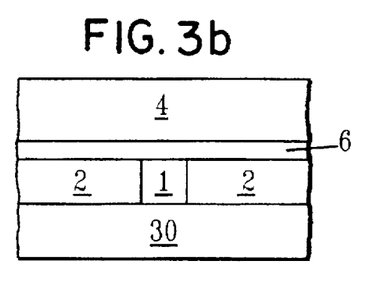
Figure 3C:
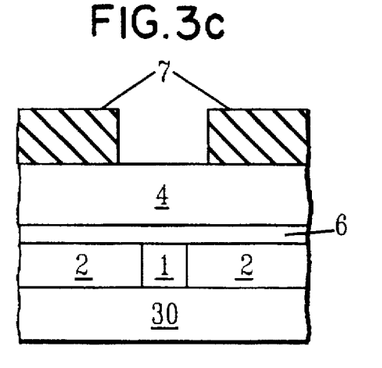
Figure 3D:
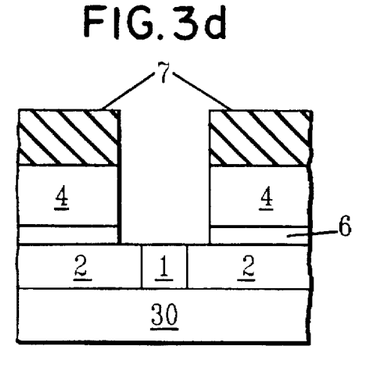
Figure 3E:
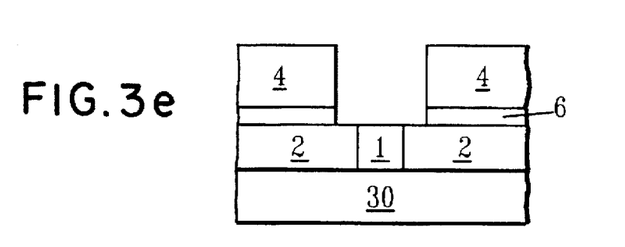
Figure 3F:
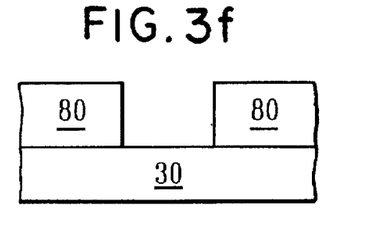
FIGS. 3(f)–3(l) are cross-sectional views depicting various steps in a Damascene embodiment of the present invention.

The nonselective plating process of the present invention includes the steps of:

a) depositing plating base or seed layer 6 (FIG. 3a) on dielectric 2 containing embedded conductive plug 1.

b) plating the material for top electrode 4 to the desired thickness (FIG. 3b).

c) applying and patterning masking material 7 (FIG. 3c).

d) transferring the pattern to the plated layer 4 and plating base 6 (FIG. 3d) by anisotropic etching.

e) removing the patterned masking material 7 (FIG. 3e) to leave top electrode 4.

Alternatively, the plated deposits may be grown as a blanket layer over a previously patterned masking layer, said masking layer containing open regions or cavities which are filled by the plated deposits. Patterning is then accomplished by polishing away any plated material remaining above the top surface of the mask. This process is known as a Damascene process, the steps of which are shown in FIGS. 3f–3l. Masking layer 80 is deposited and patterned on substrate 25 to form the structure of FIG. 3f. Said masking layer 80 is then blanket coated with seed layer 82 to form the structure of FIG. 3g. The FIG. 3g structure is then blanket plated with conductive material 84 to form the structure of FIG. 3h and planarized (by chemical mechanical polishing, for example) to form the structure of FIG. 3i. In the preferred embodiment for electrode fabrication, the mask material would be removed after the polishing step to form the structures of FIGS. 3j or 3k which differ only in that the side regions of seed layer 82 have been removed from the FIG. 3k structure (by a process such as isotropic reactive ion etching) to more fully expose the side regions of the plated electrode structures.

Figure 3G:
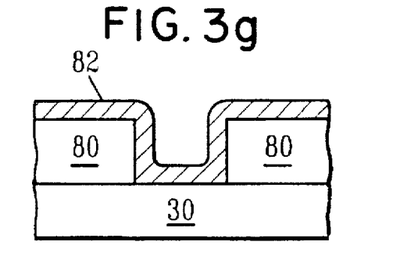
Figure 3H:
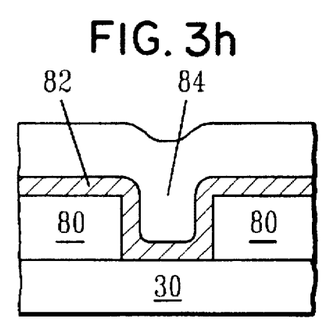
Figure 3I:
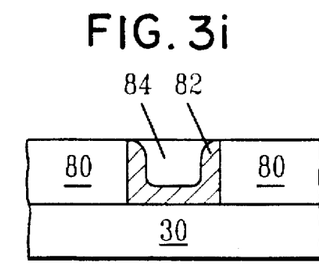
Figure 3J:
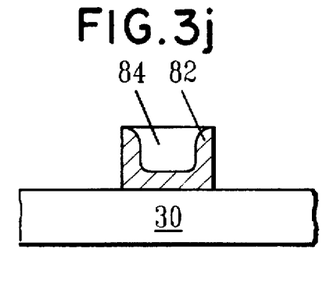
Figure 3K:
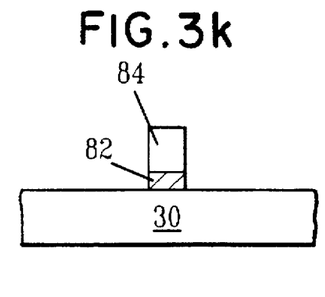
Figure 3L:
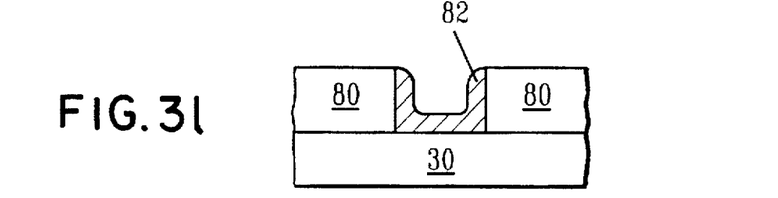

In an alternative route to the structure of FIG. 3i, the blanket seed layer 82 in the structure of FIG. 3g can be selectively removed from the top surface of the masking layer 80 (by a process such as chemical mechanical polishing) to form the structure of FIG. 3l. The structure of FIG. 3i can then be made from the structure of FIG. 3l by electroless plating.

Figure 4A:
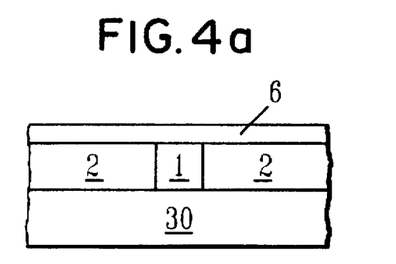
FIGS. 4(a)–4(e) are cross-sectional views depicting various steps in a selective plating process of the present invention.
Figure 4B:
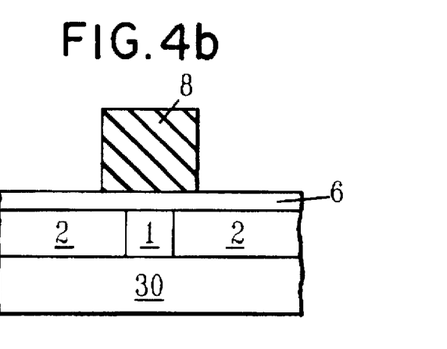
Figure 4C:
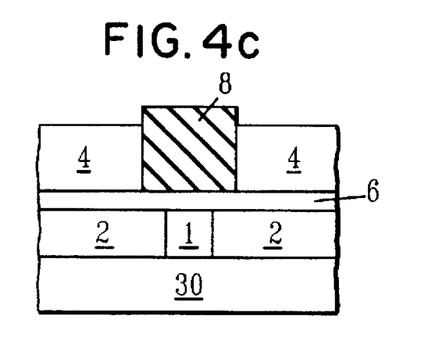
Figure 4D:
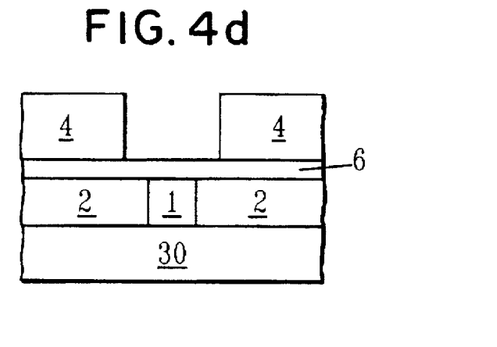
Figure 4E:
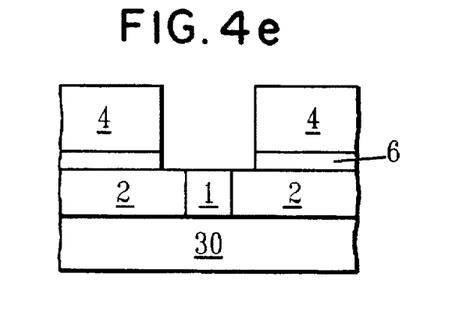

An example of a selective embodiment of this invention is a through-mask plating process. This approach is particularly useful for cases where the electrode material cannot be easily patterned by subtractive methods such as reactive ion etching (RIE). In a through-mask plating process, patterning is accomplished directly by growth of plated deposits in lithographically defined areas. The key fabrication steps for one through-mask plating process are illustrated in FIG. 4 for the case of the top electrode 4 in the isolated sidewall capacitor of FIG. 2. The steps include:

a) depositing a plating base or seed layer 6 (FIG. 4a) on dielectric 2 containing embedded conductive plug 1.

b) applying and patterning masking material 8 to cover the areas not to be plated (FIG. 4b).

c) plating material for top electrode 4 to the desired thickness (FIG. 4c).

d) removing masking material 8 (FIG. 4d).

e) removing the exposed plating base (preferably by a self-aligned anisotropic etching process) (FIG. 4e).

Figure 5:
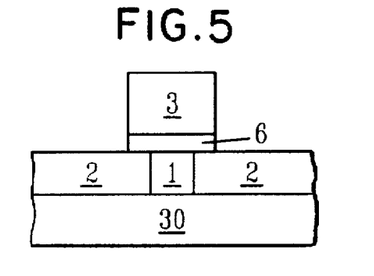
FIG. 5 is a cross-sectional view of another structure formed by the process steps of FIG. 4.
Figure 6:
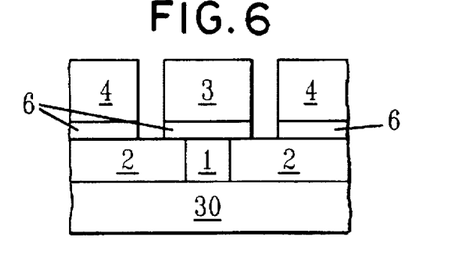
FIG. 6 is a cross-sectional view of yet another structure formed by the process steps of FIG. 4.
Figure 7:
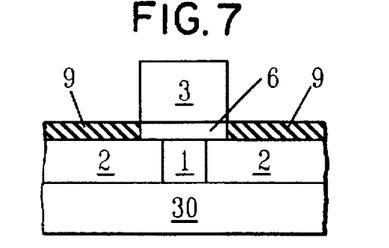
FIGS. 7 and 8 are cross-sectional views illustrating variations of the process used to form the structures of FIGS. 5 and 6, respectively.
Figure 8:
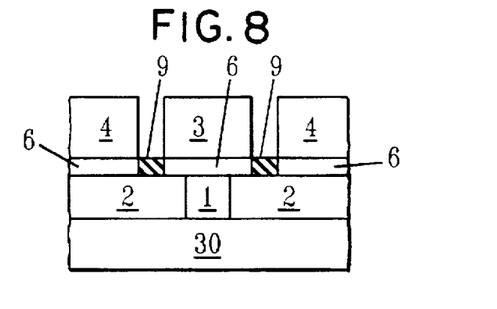

The same process steps shown in FIG. 4 could be used with a different mask to fabricate just the bottom electrode 3 resulting in the structure shown in FIG. 5, or both electrodes 3 and 4 at the same time, resulting in the structure shown in FIG. 6. The structures of FIGS. 7 and 8 illustrate how the exposed plating base which was removed from the structures of FIGS. 5 and 6 might be instead converted to an insulator 9. In an alternative version of this through-mask plating process (suitable primarily for electroless plating), the mask is deposited and patterned prior to the seed layer deposition, with the seed layer being selectively deposited (or activated) on lithographically defined areas over which the deposits are to be grown.

Masking materials used during the plating must survive the plating process intact. Photoresist masking materials are compatible with a variety of plating solutions and have the advantage that they can be patterned relatively easily. However, many photoresists are attacked by strongly alkaline plating solutions and therefore must be replaced by suitable masking materials if such plating solutions are to be used. This invention teaches the use of diamond-like carbon (DLC) as a material suitable for use with strongly alkaline plating solutions (such as plating solution for Pt manufactured by Engelhard Corp., Engineered Materials Group, East Newark, N.J., USA, and sold under the name of "Platinum A Salt Solution"). The term DLC includes hydrogenated or non-hydrogenated amorphous carbon (DLC), fluorinated amorphous carbon (F-DLC), or DLC or F-DLC containing one or more additives selected from the group containing oxygen, silicon, nitrogen, and all metallic elements. DLC is typically deposited by ion-assisted techniques, preferably by plasma assisted chemical vapor deposition (PACVD). The DLC mask is preferably patterned by reactive ion etching in a low pressure (10–20 mTorr) oxygen plasma through a mask which may consist of a single layer of patterned photoresist, or a layer of an oxygen-resistant hard mask material such as silicon nitride or silicon oxide which is patterned by reactive ion etching through a patterned photoresist mask. Adhesion of the DLC to the plating base is typically improved with the use of a 4 nm layer of PACVD amorphous silicon (a-Si:H) which may also function as a partial etch stop.

This invention was implemented as follows for the case of conventional through-mask plating of 400 nm of Pt onto a 100 nm thick Pt plating base. A Pt plating base layer was deposited on a substrate followed by the deposition of a thin layer (about 4 nm) of amorphous a-Si:H and a thicker (about 500 nm) layer of PACVD DLC. A 1.3 µm thick layer of photoresist was applied and patterned followed by $O_2$ RIE patterning of the DLC using the patterned photoresist as a mask. The exposed a-Si:H was then stripped by a short $CF_4/O_2$ RIE.

The sample was then electroplated with 300–400 nm of Pt from a commercially available plating bath (pH around 11.5, temperature around 70° C.). The DLC was stripped in an oxygen plasma, and the remaining a-Si:H was removed by $CF_4/O_2$ RIE. The exposed plating base may then be removed by anisotropic RIE or ion beam etching to form an electrode structure.

Additional treatments may be necessary to insure that the exposed surface of the plating base is in a condition suitable for plating. For example, PtO formed during exposure of the Pt plating base to $O_2$ RIE during the DLC patterning step may be eliminated by electrochemical reduction in acid (e.g., by hydrogen evolution in sulfuric acid), by a wet etch in aqueous HCl, or by RIE with $CF_4/O_2$ or $H_2$, or combinations thereof.

Implementation of this invention requires samples to be coated with a suitable seed layer or plating base. For electrolytic plating, the plating base must be sufficiently electrically conductive, adherent to the substrate, have a surface conducive to the growth of the plated deposit (e.g., free of a passivating oxide), and be in a single, topographically connected piece. The plating base typically has a thickness of 300–2000 Å but may possibly be as thin as 100 Å. Suitable plating base materials include noble metals, Cu, Sn, In, Pb, Co, and Ni. Conductive oxides would also be expected to be satisfactory as plating bases, as would bilayer or multilayer plating bases in which the top layer of the plating base might consist of one of the plating base materials just mentioned, and the bottom layer(s) of the plating base might consist of easy-to-etch metals and conductive diffusion barriers, alone or in combination. An example of a trilayer plating base would be Ti (200 Å)/TaSiN(500 Å)/Pt (100 Å) with the Pt as the top layer. The plating base may be deposited by a variety of processes including evaporation, sputtering, pyrolysis of an organometallic thin film, and in some cases, electroless plating.

Implementations of this invention further require a plating process for the chosen electrode material. Potentially suitable electrode materials that might be deposited by plating include the noble metals Au, Pt, Pd, Ir, Rh, Ru, Os, alloys of these metals with noble and non-noble metals, as well as one or more layers of noble metals over or interspersed with noble or non-noble metals.

Figure 9:
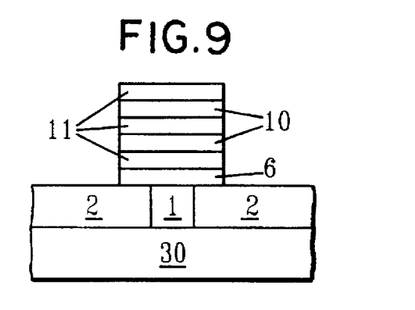
FIG. 9 is a cross-sectional view of a multilayered electrode structure formed by a process of the present invention.

A basic example of a multilayered electrode structure is shown in FIG. 9 for the case of a bottom electrode. The layers 10 and 11 might be Pt and Pd; the plating base layer 6 might also be Pt. Multilayered electrode structures can be sequentially deposited from separate plating baths in a straightforward manner. In certain cases, multilayered electrode structures might alternatively be electrodeposited from a single plating bath containing appropriate precursor species for each of the metals to be deposited, where selectivity is accomplished by modulation of the plating current or potential.

Figure 10:
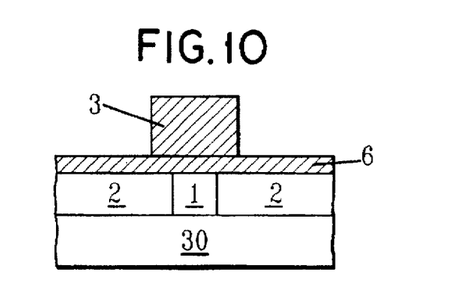
FIGS. 10–12 are cross-sectional views of three structures from which the exposed plating base layers can be removed in accordance with the present invention.
Figure 11:
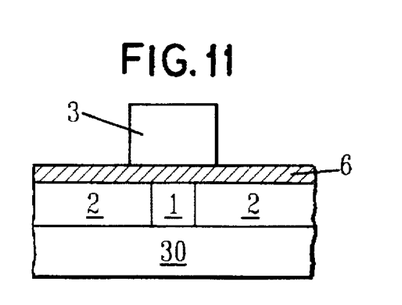
Figure 12:
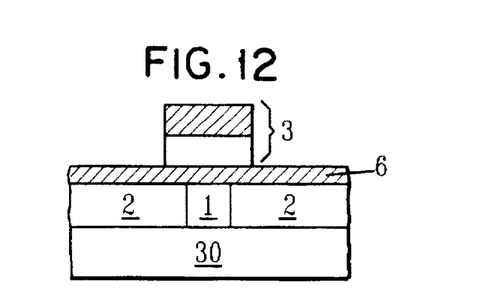

Examples of methods to remove the exposed plating base after electrode plate-up are described with reference to the structures of FIGS. 10–12. FIG. 10 shows a structure in which the plating base and plated electrode are made from the same material (e.g., Pt). In this case, a self-aligned anisotropic RIE or ion beam etching step could be used to remove the exposed regions of plating base 6. Also removed in such a process would be the topmost portion of the electrode; the thickness of this material removed from the electrode would be equal to that of the removed plating base. FIGS. 11 and 12 show structures in which the plating base and plated electrode are made from the different materials. FIG. 11 shows an example of a Pt plating base and a Pd electrode; FIG. 12 shows an example of a Pt plating base and a bilayer Pd/Pt electrode. A self-aligned anisotropic RIE or ion beam etching step could again be used to remove the exposed regions of plating base 6. However, selective etch gas chemistries may be utilized to avoid losing the topmost layer electrode layer. Wet etching is best used only in cases in which the plating base is thin compared with the lateral dimensions of the electrode, since wet etching processes tend to be isotropic and may lead to plating base undercutting.

Figure 13:
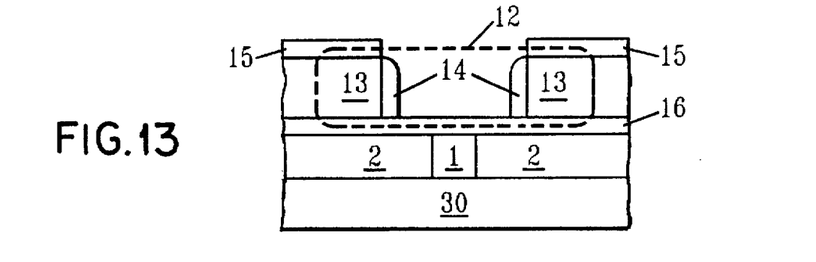
FIG. 13 is a cross-sectional view of a compound electrode structure formed by a plating method in accordance with the present invention in which the plating is selective (on the electrode sidewalls) but not through-mask.
Figure 14A:
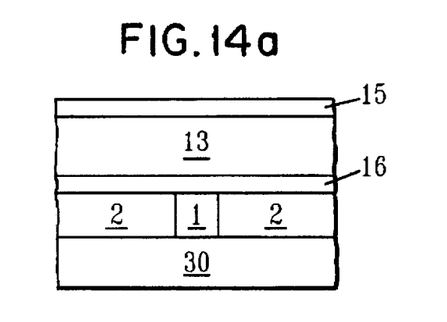
FIGS. 14(a)–14(f) are cross-sectional views depicting various steps in forming a capacitor having an electrode as in FIG. 13.
Figure 14B:
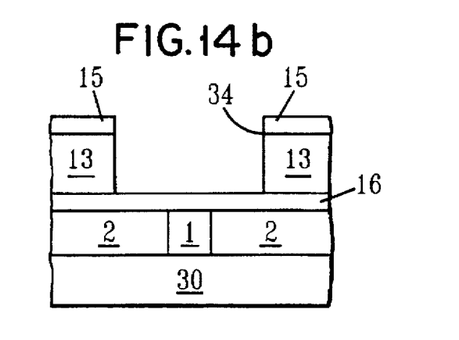
Figure 14C:
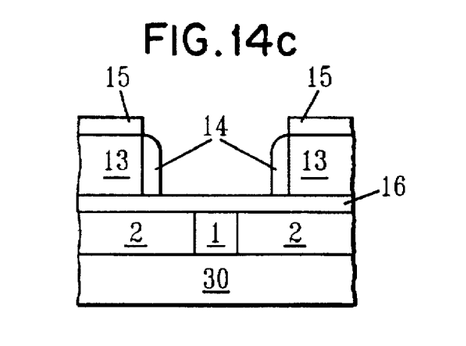
Figure 14D:
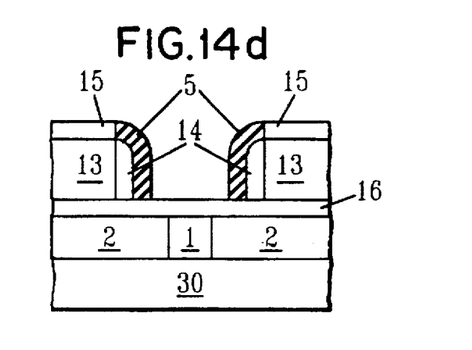
Figure 14E:
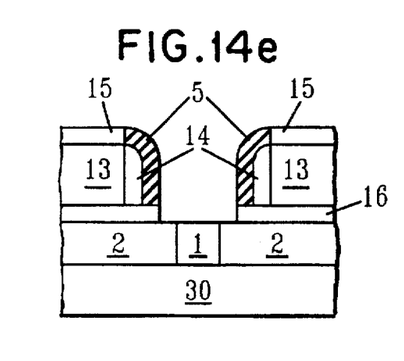
Figure 14F:
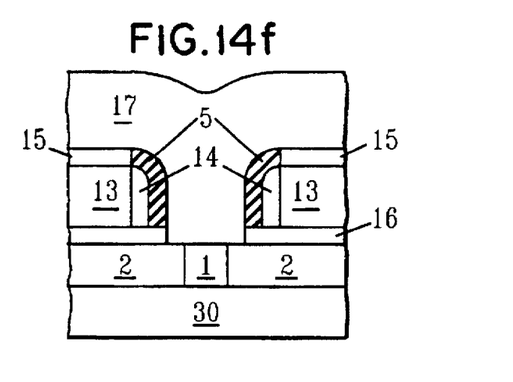

FIG. 13 shows a compound top electrode structure 12 in which the plating is selective, but not through-mask. In this case, the plated deposits are conformally grown as a coating on the exposed regions of a preexisting electrode structure, said preexisting electrode structure previously deposited by electrodeposition or some other method. The compound top electrode 12 consists of a horizontal portion 13 and a vertical sidewall portion 14. This structure has the advantage that it incorporates an additional dielectric overlayer 15 and an additional underlayer 16. The layer 15 provides additional resistance to shorting between the top and bottom electrodes. The layer 16 is preferably dielectric, functions as a barrier layer to protect plug 1 during deposition of the capacitor dielectric (5 in FIGS. 1, 2 and 14), and is removed from the area over the plug prior to completion of the bottom electrode.

The steps for making a capacitor with this compound top electrode are illustrated in FIG. 14. First, a stack consisting of underlayer 16, top electrode horizontal portion 13, and dielectric overlayer 15 is deposited on the substrate (FIG. 14a). The electrode portion 13 consists of one (or more) layers of conductive material, and may be plated (e.g., vapor deposition of plating base followed by electroplating) or deposited by a vapor deposition process. A possible material for horizontal electrode portion 13 would be Pd. Next, an opening 34 is etched through overlayer 15 and horizontal top electrode layer 13, stopping on layer 16 (FIG. 14b). The vertical sidewall portion 14 of the electrode is then deposited by plating of a material such as Pt (FIG. 14c). The plating process is selective; growth only occurs on the exposed electrode sidewalls. The capacitor might be completed as shown in FIGS. 14d–f. After deposition of a thin layer of capacitor dielectric, and etching to form sidewall spacers 5 (FIG. 14d), layer 16 is opened (using spacers 5 as a mask) to expose plug 1 (FIG. 14e). Bottom electrode material 17 is then deposited and patterned (FIG. 14f).

FIG. 15 shows how one might use noble metal plating in the fabrication of a trench-like capacitor structure with a buried contact plate. As in the embodiment of FIG. 13, the electrode deposition is selective, but not through-mask.

Figure 15A:
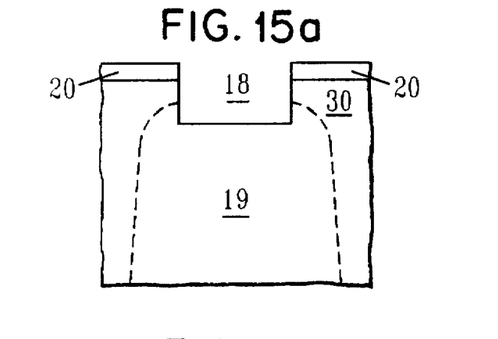
FIGS. 15(a)–15(f) are cross-sectional views depicting steps in the formation of a trench capacitor using the plating method of the present invention.
Figure 15B:
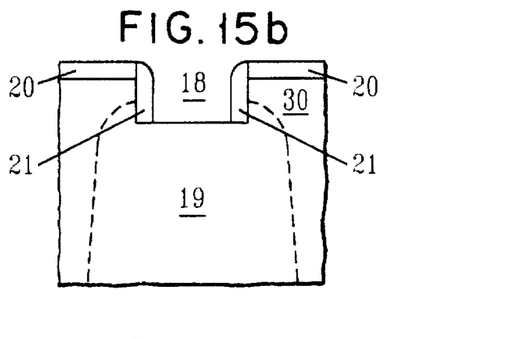
Figure 15C:
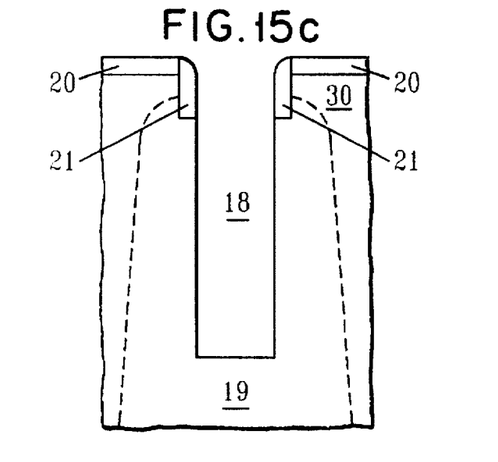
Figure 15D:
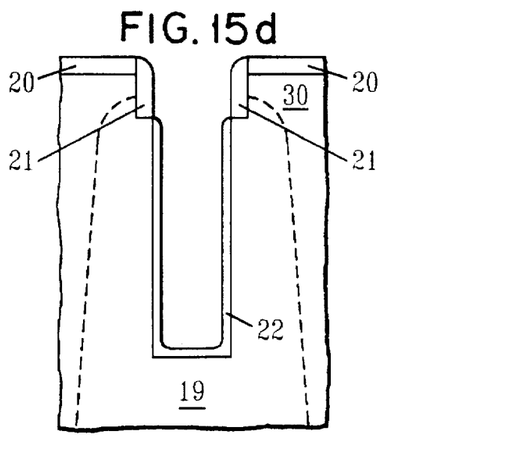
Figure 15E:
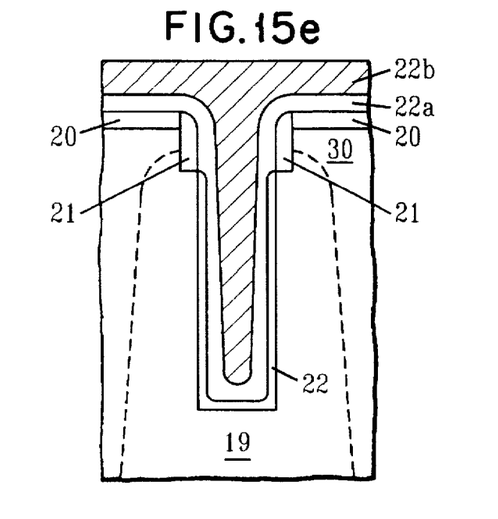
Figure 15F:
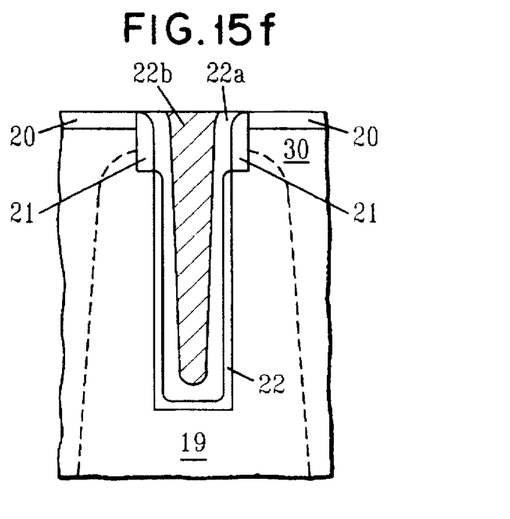

In FIG. 15a, the top portion of trench 18 is formed in a semi-insulating silicon substrate 30 having conductive n+−Si buried contact regions 19 and an insulating oxide or nitride cap layer 20. The top portion of trench 18 is then lined with insulating sidewall spacers 21 (FIG. 15b), and deepened (by RIE) to its final length as shown in FIG. 15c. Top electrode material 22 is then formed on the silicon sidewalls of the trench by plating (FIG. 15d). The structure is then conformally coated with a thin layer of capacitor dielectric 22a and bottom electrode material 22b (FIG. 15e), and then planarized to form the structure of FIG. 15f. The isolated bottom electrode is then strapped to an FET (not shown).

Figure 16A:
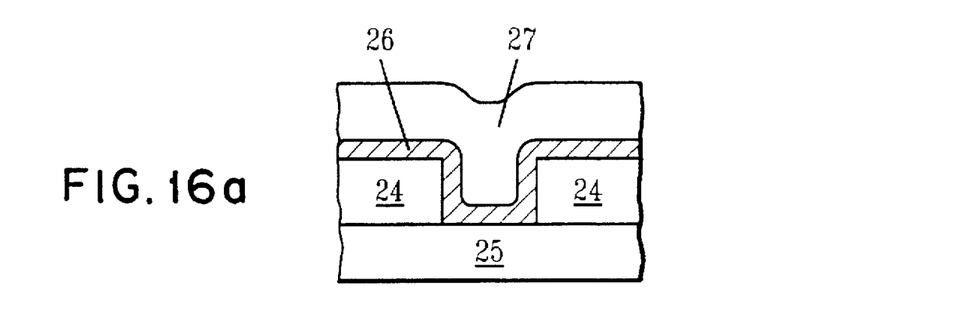
FIGS. 16(a)–16(b) are cross-sectional views depicting the steps in forming a patterned conductor using a Damascene process in which the mask material remains in the final structure.
Figure 16B:
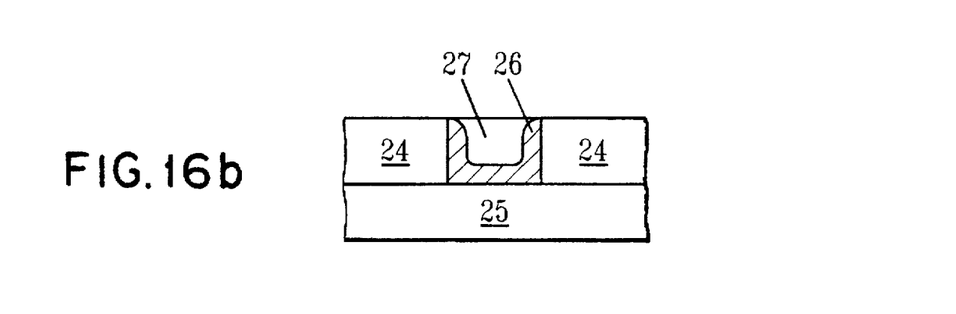

It should be noted that the DLC masking material is ideally suited to a variety of electrolytic and electroless plating applications, and not limited to through-mask noble metal plating in alkaline solutions. For example, the use of DLC as the interlayer dielectric in a Damascene process for back-end-of-the-line wiring enables the use of electroless copper alloy plating from alkaline solutions, since these alkaline solutions tend to attack the more commonly used ILDs such as $SiO_2$ and polyimide. An example of the use of a DLC masking material is shown in FIG. 16 for one layer of a Damascene plating process. FIG. 16a shows the patterned DLC dielectric 24 on substrate 25, the conformally coated seed layer 26, and the plated conductive material 27. FIG. 16b shows the layer after chemical-mechanical polishing. In contrast to the use of DLC in the through-mask plating process of FIG. 4, the DLC in the Damascene process may remain in the final structure.

Figure 17:
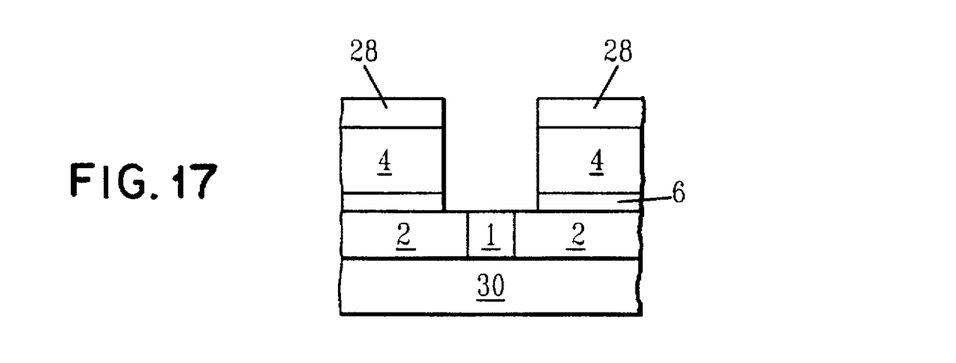
FIG. 17 is a cross-sectional view of a patterned electrode structure capped with a patterned dielectric.
Figure 18A:
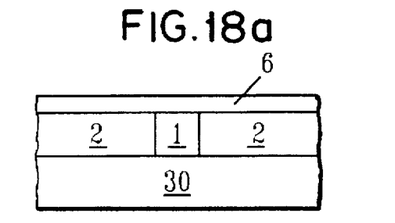
Figure 18B:
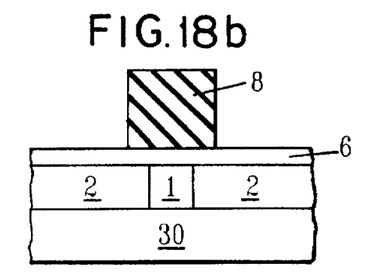
Figure 18C:
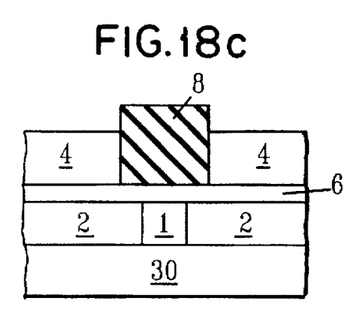
Figure 18D:
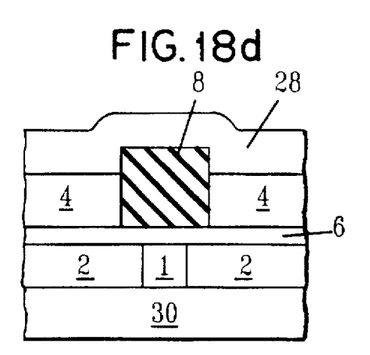
Figure 18E:
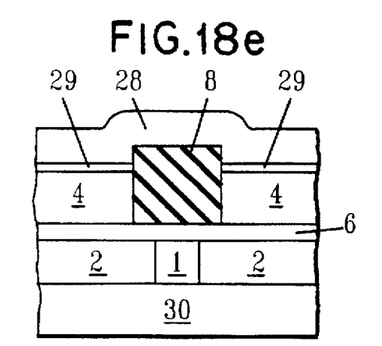
Figure 18F:
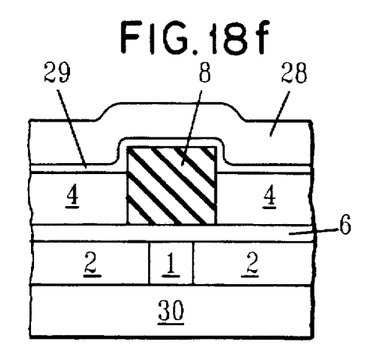
Figure 18G:
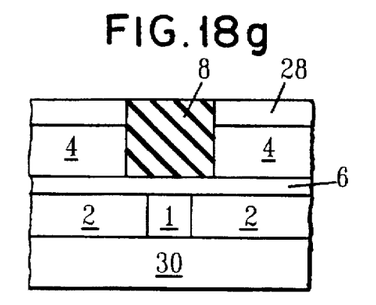

Process steps additional to those shown in FIG. 4 are needed when the through-mask plated electrodes are to be capped with an identically patterned dielectric (28 in FIG. 17). The steps to accomplish this with a self-aligned process are as follows:

a) depositing plating base or seed layer 6 (FIG. 18a).

b) applying and patterning masking material 8 to cover the areas not to be plated (FIG. 18b). The masking material should be selected to withstand exposure to (i) the plating solution and (ii) the cap dielectric deposition process. With respect to the cap dielectric, the masking material should further be (i) a good polish stop and (ii) selectively etchable. The thickness of the masking material should be approximately equal to the sum of the desired electrode and cap layer thicknesses.

c) plating material for top electrode 4 to the desired electrode thickness (FIG. 18c).

d) depositing the desired thickness of cap dielectric 28 as a blanket film (FIG. 18d). If necessary, an adhesion layer 29 might be applied as shown in FIG. 18e or FIG. 18f.

e) planarizing the cap dielectric 28 by a process such as chemical mechanical polishing (CMP), stopping on the mask material 8 (FIG. 18g).

f) selectively remove the newly exposed mask material 8 and those portions of the plating base 6 previously under the mask (FIG. 18h).

A preferred embodiment of this process would use DLC as the mask, with $SiO_2$ or $SiN_x$ as the cap dielectric, said cap dielectrics preferably being deposited by a low temperature process such as plasma-enhanced chemical vapor deposition (PECVD) or a spin-on-glass process.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for forming a capacitor for a semiconductor device, said method comprises the steps of:

plating a noble metal electrode, said plated noble metal electrode being selected from the group consisting of pure noble metals and alloys of noble metals;

depositing a high-epsilon or ferromagnetic material on at least some surfaces of said plated noble metal electrode; and depositing a counterelectrode on said high-epsilon or ferromagnetic material.

2. The method of claim 1 wherein said noble metal electrodes consist of one or more layers of pure noble metals, alloys of noble metals, or a combination thereof.

3. The method of claim 1 wherein the plating step is nonselective and comprises the steps of plating a blanket film of said noble metals and then patterning the film after deposition.

4. The method of claim 3 wherein the plating step is part of a Damascene process comprising the steps of:

a) forming a patterned masking layer, said masking layer containing open regions or cavities;

b) blanket depositing a seed layer or plating base on said masking layer and openings contained therein;

c) plating a film of noble metals as a blanket layer over the patterned mask, completely filling the openings contained therein;

d) polishing away any plated or seed layer material remaining above the top surface of the mask.

5. The method of claim 1 wherein the plating step is selective and the plated deposits are selectively grown in lithographically defined areas by through-mask plating.

6. The method of claim 1 wherein the plating step is selective and the plated deposits are conformally grown as a coating on a preexisting electrode structure.

7. The method of claim 5 wherein said plating comprises the steps of:

a) blanket deposition of a seed layer or plating base;

b) application and patterning of a first disposable material to cover regions where plating is not desired;

c) plating regions not covered by the first disposable material with an electrically conductive material;

d) removing the first disposable material; and e) removing those portions of the plating base exposed by removal of the first disposable material.

8. The method of claim 7 wherein the first disposable material is selected from the group consisting of a photoresist, x-ray resist, or e-beam or ion-beam resist.

9. The method of claim 7 wherein the first disposable material is an inorganic material selected from the group consisting of oxides or nitrides.

10. The method of claim 7 wherein the first disposable material is diamond-like carbon, said diamond-like carbon being selected from the group consisting of hydrogenated or non-hydrogenated amorphous carbon (DLC), fluorinated amorphous carbon (F-DLC), or DLC or F-DLC containing one or more additives selected from the group containing oxygen, silicon, nitrogen, and all metallic elements.

11. The method of claim 7 wherein those portions of the plating base exposed by removal of the first disposable material are removed by an etching process selected from the group consisting of ion beam sputtering, plasma etching, RIE, ion-assisted etching, chemical etching, and wet etching.

12. The method of claim 7 wherein those portions of the plating base exposed by removal of the first disposable material are made to become insulating by a process of oxidation or anodization.

13. A method for plating onto a substrate to provide a pattern of conductive materials thereon comprising the steps of:
   a) depositing a blanket layer of a first conductive material on a substrate;
   b) applying a DLC mask layer on said blanket layer;
   c) patterning said DLC mask layer to provide exposed areas of said blanket layer
   d) plating said exposed areas of said blanket layer with a second conductive material to form a pattern of conductive features;
   e) removing the DLC mask layer to expose areas of said first conductive material; and
   f) removing said exposed areas of said first conductive material.

14. The method according to claim 13, wherein the plating step is selective and the plated deposits are selectively grown in lithographically defined areas by a through-mask plating process.

15. The method according to claim 13, wherein the plating is part of a Damascene-type plating process, including the steps of:
   a) forming a patterned DLC masking layer, said DLC masking layer containing open regions or cavities;
   b) blanket depositing a seed layer on said DLC masking layer and openings contained therein;
   c) plating a metal film as a blanket layer over the patterned DLC mask, completely filling the openings contained therein;
   d) polishing away any plated or seed layer material remaining above the top surface of the DLC mask.

16. The method according to claim 13, wherein the plating is electroless and includes the steps of:
   a) forming a patterned DLC masking layer, said DLC masking layer containing open regions or cavities;
   b) selectively depositing a seed layer on the interior surfaces of said cavities;
   c) selectively filling said cavities with metal by electroless plating.

17. The method of claim 13 wherein the DLC patterning comprises the steps of:
   a) depositing an adhesion layer on a substrate, said substrate optionally coated with a seed layer;
   b) depositing the desired thickness of said DLC mask layer on said substrate;
   c) depositing a thin layer of a hard mask material on said DLC layer;
   d) applying, exposing and developing a layer of photoresist on said hard mask layer;
   e) patterning the hard mask by reactive ion etching, using the photoresist as a mask;
   f) patterning the DLC layer using the hard mask as a mask, stopping on the adhesion layer;
   g) removing the exposed adhesion layer; and
   h) cleaning the exposed substrate or seed layer surface.

18. A self-aligned process for capping the pattern of conductive features of claim 13 with an identically patterned dielectric, said process comprising the steps of:
   a) depositing a blanket layer of a first conductive material onto a substrate;
   b) applying and patterning a first disposable material to cover regions where plating is not desired, the thickness of said first disposable material being approximately equal to the sum of the desired electrode and cap layer thicknesses;
   c) plating electrode material to the desired thickness;
   d) depositing the desired thickness of cap dielectric as a blanket film;
   e) planarizing the cap dielectric by chemical mechanical polishing, stopping when the first disposable material is exposed; and
   f) selective removal of the newly exposed first disposable material and those portions of the plating base previously under the mask.

19. The method of claim 18 wherein DLC is the first disposable material, with the cap dielectric selected from the group of materials consisting of $SiO_2$, $SiN_x$, or other high-epsilon or low-epsilon dielectric material.

20. The method of claim 1 wherein said noble metals are plated by a method selected from the group consisting of electrolytic, electroless, or a combination thereof.

21. The method of claim 1 wherein said pure noble metals are selected from the group consisting of Au, Pt, Pd, Ir, Rh, Ru, and Os.

22. The method of claim 1 wherein said alloys are alloys of noble metals or alloys of noble and nonnoble metals.

23. The method of claim 1 wherein said alloys are selected from the group consisting of PtIr, PdIr, PtCu, PtPd, PdNi and PdCo.

24. The method of claim 13 wherein said plating is selected from the group consisting of electrolytic, electroless or a combination thereof.

25. The method of claim 13 wherein said second conductive material is selected from the groups of metals, (a) Au, Pt, Pd, Ir, Rh, Ru and Os, (b) alloys of noble metals or alloys of noble and non-noble metals, (c) PtIr, PdIr, PtCu, PtPd, PdNi and PdCo, plus copper and alloys of copper with any of the elements Ag, Zn, Cd, Au, Pd, Hg, Pt, In, Ni, B, Sn, Co, Cr, Ge, and Pb, alone or in combination.

26. The method of claim 6 wherein the preexisting electrode structure is deposited by plating.

27. The method of claim 7 wherein the electrically conductive material is the same as the plating base material.

28. The method of claim 7 wherein the electrically conductive material is different from the plating base or seed layer material.

29. The method of claim 13 wherein said DLC mask is a material selected from the group consisting of hydrogenated or non-hydrogenated amorphous carbon (DLC), flourinated amorphous carbon (F-DLC), or DLC or F-DLC containing one or more additives selected from the group consisting of oxygen, silicon, nitrogen and all metallic elements.

* * * * *

UNITED STATES PATENT AND TRADEMARK OFFICE
CERTIFICATE OF CORRECTION

PATENT NO. : 5,789,320
DATED : August 4, 1998
INVENTOR(S) : Panayotis C. Andricacos, et al.

It is certified that error appears in the above-indentified patent and that said Letters Patent is hereby corrected as shown below:

Column 10, lines 14 & 18: "ferromagnetic" should read --ferroelectric--

Signed and Sealed this

Twenty-ninth Day of December, 1998

*Attest:*

BRUCE LEHMAN

*Attesting Officer*     Commissioner of Patents and Trademarks